Oct. 31, 1961 I. F. BARDITCH 3,007,119

MODULATING CIRCUIT AND FIELD EFFECT SEMICONDUCTOR STRUCTURE FOR USE THEREIN

Filed Nov. 4, 1959

WITNESSES

John C. Healy, Jr.

James F. Young

INVENTOR
Irving F. Barditch
BY Maury I. Hull
ATTORNEY

United States Patent Office 3,007,119

Patented Oct. 31, 1961

3,007,119

MODULATING CIRCUIT AND FIELD EFFECT SEMICONDUCTOR STRUCTURE FOR USE THEREIN

Irving F. Barditch, Baltimore, Md., assignor to Westinghouse Electric Corporation, East Pittsburgh, Pa., a corporation of Pennsylvania Filed Nov. 4, 1959, Ser. No. 850,823

9 Claims. (Cl. 332—31)

This invention relates to improvements in modulating circuits, and more particularly to modulating circuits especially suitable for gating and mixing, and to a semiconductor device for use therein in which a field effect is employed to control carrier movement.

Prior art field effect semiconductor devices have been characterized by a number of disadvantages and limitations. In one such prior art device a solid rod or bar of N-type germanium has a ring-shaped zone or region of P-type germanium centrally disposed thereof. A negative potential is applied to the ring of P-type germanium to control carrier movement in the bar of N-type germanium by utilizing depletion effects, but the volume which must be depleted requires that a high negative potential be applied to the P-type ring, and furthermore, it is impractical with such a structure to use more than one ring because of leakage between rings.

Other semiconductor modulating structures may operate by controlling the space charge region separating two oppositely doped germanium conductors, but such an arrangement is complicated and difficult to construct. Still other devices have attempted to obtain a field effect transistor or semiconductor based on the use of non-single crystals, but such devices are complicated, expensive and difficult to manufacture.

In summary, the modulating apparatus and semiconductor structure of the instant invention overcome these and other disadvantages of the prior art by providing a structure which consists of a hollow cylindrical portion of an intrinsic semiconductor, for example germanium, the region adjacent the inner surface of the hollow cylinder being doped to form either a P or N doped semiconductor core, and which structure also has ring portions of oppositely doped semiconductor material disposed at spaced intervals around the outside of the cylindrical portion, the ring portions extending deeply enough into the intrinsic semiconductor cylindrical portion to affect the oppositely doped core structure while leaving a thin layer of intrinsic semiconductor between the outer ring portions and the inner core. An electrostatic field placed on one or more of the outer rings acts to bias through the bulk of the intrinsic layer into the inner core and thus effectively pinch off current in the conducting inner core by controlling the direction of movement of the carriers in the inner core portion. A field of sufficient magnitude placed on one or on all of the rings may create this gating effect. There is no conduction between adjacent semiconductor rings of the oppositely doped material, so the only losses are in capactive charging these rings with respect to the inner core portion, and very small leakage losses occur.

Accordingly, a primary object of the instant invention is to provide a new and improved semiconductor structure.

Another object is to provide a new and improved modulating circuit employing a semiconductor structure.

Still a further object is to provide a new and improved multiple field effect semiconductor structure characterized by ease of construction.

These and other objects will become more clearly apparent after a study of the following specification when studied in connection with the accompanying drawings, in which.

Figure 4A:
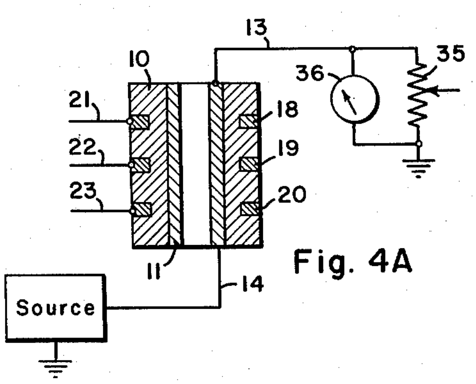
Figure 5:
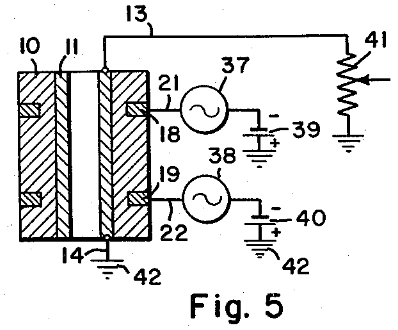
Figure 4B:
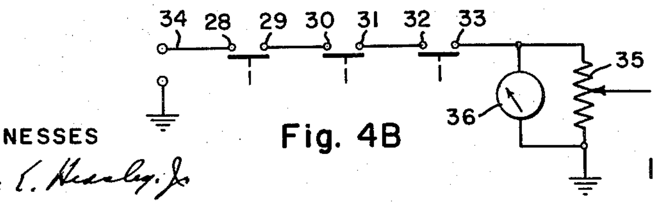

FIGS. 4*a* and 4*b* show an "AND" circuit form of modulator using the semiconductor structure and an equivalent relay circuit respectively; and FIG. 5 shows a mixing circuit form of modulator using the semiconductor structure.

Figure 1:
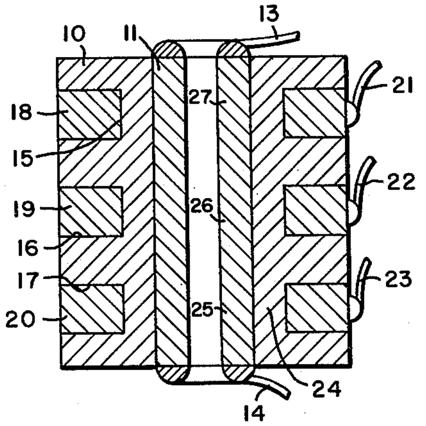
FIGURE 1 is a cross-sectional view through the semiconductor structure according to the preferred embodiment of the invention.
Figure 3:
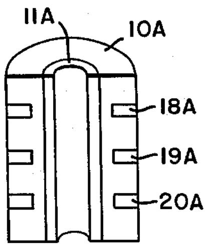
FIG. 3 is a view of a half-cylinder form especially suitable for use with dendrites.

Referring now to the drawings for a more detailed understanding of the invention, and in particular to FIG. 1 thereof, there is shown at 10 a hollow cylindrical portion of intrinsic germanium. The region 11 adjacent the inner surface is doped to form a core portion of germanium of one conductivity type, for example, N-type germanium, and having ohmic leads 13 and 14 connected to the upper and lower ends thereof respectively. Portion 11 has a preselected finite depth or thickness and preselected carrier concentration, in accordance with desired characteristics. The portion 10 has disposed therein at preferably equally spaced intervals a number of, in the example shown 3, oppositely doped ring portions 18, 19 and 20 of P germanium, the other conductivity type. Numerals 15, 16 and 17 indicate the positions of the groove-shaped junctions between the P-type ring portions and the intrinsic semiconductor portion. The ring portions 18, 19 and 20 have ohmic contacts and leads 21, 22 and 23 connected thereto respectively.

Figure 2:
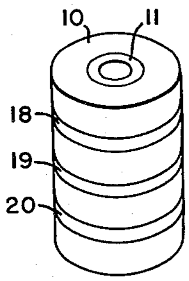
FIG. 2 is a view in perspective of a semiconductor structure constructed according to the showing of FIG. 1.

Particular reference is made now to FIG. 2 in which a structure constructed according to the teachings of FIG. 1 is shown in perspective view.

In the operation of the structure of FIG. 1, only the majority carriers in the N-type germanium 11 are used. Assume by way of describing the operation that a source of direct current potential is applied between lead 14 and lead 23 with the negative terminal of the source of potential applied to lead 23, which it will be recalled is connected to the ring portion of P-type germanium 20. A negative electrostatic field is developed in the adjacent region of core portion 11 through the intervening section or zone 24 of the intrinsic germanium portion 10. In accordance with well known semiconductor theory that an electric field applied to the semiconductor may be used to control the direction of drift or movement of the carriers in the semiconductor, the negative field in the region 25 of core 11 adjacent the section 24 causes the carriers in this zone 25 of the N germanium core 11 to be turned around, effectively stopping current flow therein which as previously stated is dependent upon the majority carriers, in this case electrons. It should be noted that the negative potential applied to lead 23 back-biases or reverse biases the P—I junction between portion 10 and portion 20 so that substantially no current flows. It should also be noted that the carriers in the P-type germanium 20 enhance the effect of the electrostatic field and increase the field strength by allowing all parts of the ring portion 20 to be more intimately used in establishing the electrostatic field. It should further be noted that the volume of the hollow cylindrical core portion 11 is quite small, so that to obtain a complete stoppage of carrier movement in the zone or region 25 thereof adjacent zone or region 24 only a relatively small negative potential need be applied to lead 23.

A similar effect may be noted if instead of applying a negative potential to lead 23 the negative potential is applied to lead 22. In this case the ring portion 19 sets up a negative field in the region 26 of the N germanium core 11, stopping the movement of carriers in this region. In a similar manner, a negative potential applied to lead 21 and P germanium ring 18 would stop the movement of the carriers, in this case electrons, in the region 27 of the N germanium core 11.

It will be readily apparent that the semi-conductor structure shown in FIG. 1 is ideally suited for an "AND" circuit since substantially no current is drawn from any of the leads 21, 22 and 23. Particular reference is made now to FIG. 4*b* in which a normal relay "AND" circuit is shown for the purposes of comparison. Only when the circuit of lead 34 is completed through contacts 28—29, and contacts 30—31, and contacts 32—33 is a signal on lead 34 delivered to a utilization device 35, shown as a potentiometer, the presence of which signal may be indicated by indicator 36.

Particular reference should be made now to FIG. 4*a* in which a modulator gating circuit utilizing the semiconductor structure is shown to have lead 13 connected to the utilization device 35 and indicator 36 and lead 14 connected to a source of potential to be gated. Assuming leads 21, 22 and 23 are normally energized by negative potentials of at least a predetermined amplitude, only when lead 21 and lead 22 and lead 23 are deenergized does the movement of carriers through the semiconductor core portion 11 cause the desired output at 35.

It should be understood that whereas the cylindrical core portion 11 has been described as being composed of N-type germanium and the rings 18, 19 and 20 composed of P-type germanium that instead the core portion 11 could be composed of P-type germanium and the ring portions 18, 19 and 20 composed of N-type germanium, in which case positive potentials applied to leads 21, 22 and 23 would set up positive fields which would control the movement of other majority carriers in core portion 11 in a similar manner.

Particular reference should be made now to FIG. 5 which shows a modulating circuit with the semi-conductor structure, having only two semiconductor ring portions for simplicity of illustration, connected therein to effect mixing of two alternating current signals. Assuming that as before, as described in connection with FIG. 1, core portion 11 of FIG. 5 is of N-type germanium and ring portions 18 and 19 are of P-type germanium; then leads 21 and 22 are connected to sources of alternating current signals 37 and 38 which may be of two different frequencies, which are connected by way of sources of bias potential 39 and 40 respectively to ground 42. Lead 14 is also connected to ground 42. The alternating current potentials from 37 and 38 superimposed upon their respective steady negative bias voltages from sources 39 and 40 establish negative fields of periodically varying strengths in the adjacent zones or regions of semiconductor core portion 11 and accordingly vary the movement of the majority carriers, in this case electrons, in the adjacent zones of core portion 11, and the resulting potential developed across leads 13 and 14 which is applied to a utilization or load device 41 represents a signal having a frequency corresponding to $F_1$ plus and minus $F_2$, where $F_1$ is the frequency of signal source 37 and $F_2$ is the frequency of signal source 38.

There has been provided then apparatus well suited to accomplish the aforedescribed objects of the invention.

Furthermore, the apparatus of the instant invention may be conveniently constructed by easily handled techniques including gaseous diffusion, drilling and vapor plating. A solid cylinder of intrinsic semiconductor may have a bore made axially thereof by any convenient means. The entire surface except the area to form the core is then masked with an oxide film, and the cylinder subjected to an impurity vapor, for example arsenic, in the presence of heat. The impurity is allowed to diffuse into the semiconductor to the desired concentration and depth. After cleaning, the surface is masked again except for the areas of the rings, and the cylinder diffused with an impurity of the other conductivity type, for example, indium.

As an alternative method of construction, preformed rings of alloy may be fused onto the cylinder to form fused junctions.

Whereas the invention has been shown and described with reference to the semiconductor germanium, it should be understood that other suitable semiconductors, for example, silicon could be employed, the requirement being that the semiconductor have two conductivity types.

Whereas the invention has been shown and described with respect to embodiments thereof which give satisfactory results, it should be understood that changes may be made and equivalents substituted without departing from the spirit and scope of the invention.

I claim as my invention:

1. A field effect semiconductor device requiring no P-N junction consisting of a first hollow cylindrical portion composed of an intrinsic undoped substantially pure semiconductor material, the region adjacent the inner surface of said cylindrical portion being doped to form an impure cylindrical-shaped semiconductor core of one conductivity type inside said first cylindrical portion, said first cylindrical portion having a plurality of doped ring portions of the other conductivity type on the outside thereof at spaced intervals along the length thereof, each of the ring portions being isolated from any adjacent ring portion by a portion of undoped intrinsic semiconductor material therebetween, said ring portions extending into the hollow cylindrical portion of intrinsic semiconductor material to a depth such that pure intrinsic semiconductor material of predetermined thickness separates the ring portions from said core.

2. A field effect semiconductor structure requiring no P-N junction consisting of a hollow cylindrical portion composed of an intrinsic undoped substantially pure semiconductor, the region adjacent the inner surface of said cylindrical portion being doped to form an impure semiconductor core of one conductivity type, said cylindrical portion having a plurality of annular ring portions disposed on the outside thereof at spaced intervals along the length thereof, said ring portions being doped with impure semiconductor material of the other conductivity type, said ring portions extending into the cylindrical portion to a depth such that pure intrinsic semiconductor material of predetermined thickness separates the ring portions from said core, a direct current potential of a predetermined polarity applied between said inner core and one of said ring portions of semiconductor material of the other conductivity type setting up an electrostatic field of predetermined polarity in the cylindrical portion adjacent said one ring portion and in the adjacent region of the core which diminishes the movement of majority carriers in said core.

3. A semiconductor structure consisting of a hollow cylinder of intrinsic undoped substantially pure semiconductor material, the region adjacent the inner surface of said cylinder being doped to form an N-type semiconductor core, said cylinder having at least one annular ring portion of P-type semiconductor material on the outside thereof and adapted to have a potential applied thereto between the ring portion and the core, said ring portion extending into the cylindrical portion to a depth such that pure intrinsic semiconductor material of predetermined thickness separates the ring portion from said N-type core, a negative potential applied to the ring portion creating an electrostatic field of predetermined polarity in a zone of the cylinder adjacent the ring portion and in a zone of the core and limiting the movement of electron carriers in the N-type core.

4. A semiconductor structure consisting of a hollow cylinder of intrinsic undoped substantially pure semiconductor material, the region adjacent the inner surface of said cylinder being doped to form a P-type semiconductor core, said cylinder having at least one annular ring portion of N-type semiconductor material on the outside thereof, said ring portion extending into the cylindrical portion to a depth such that pure intrinsic semiconductor material of predetermined thickness separates the ring portion from said core of P-type material, said ring portion of N-type semiconductor material while a positive potential with respect to the P-type core is applied thereto creating a positive electrostatic field in the zone of the core adjacent the ring portion thereby restricting the movement of majority carriers in the core.

5. Apparatus according to claim 2 wherein the cylindrical portion of intrinsic semiconductor material is additionally characterized as substantially eliminating current flow between the core and the semiconductor ring portion.

6. Apparatus according to claim 2 wherein the intrinsic semiconductor material disposed between adjacent ring portions of the same conductivity type limits leakage between adjacent semiconductor ring portions to an inconsequential value.

7. A modulating circuit comprising, in combination, a semiconductor element consisting of a hollow cylindrical portion of intrinsic semiconductor material, the region adjacent the inner surface of the cylindrical portion being doped to form an impure core of one conductivity type, said hollow cylindrical portion having first and second spaced ring portions of impure semiconductor material of the other conductivity type therein on the outer surface thereof, said first and second ring portions extending into the cylindrical portion to a depth such that pure intrinsic semiconductor material of predetermined thickness separates the ring portions from said core, the first and second ring portions being isolated from each other by a portion of undoped intrinsic semiconductor material therebetween, signal means connected to one end of said core, utilization means connected to the other end of said core, and first and second potential means connected to the first and second ring portions respectively for applying potentials thereto to establish electrostatic fields in the zones of the core adjacent the first and second ring portions and control the movement of carriers in said core, the signals passed through the core to the utilization means representing the summation of potentials applied to the first ring portion and the second ring portion.

8. A modulating circuit for mixing comprising, in combination, a semiconductor element consisting of a hollow cylindrical portion of intrinsic semiconductor material, the region adjacent the inner surface of the cylindrical portion being doped to form an impure core of one conductivity type, said cylindrical portion having first and second spaced annular ring portions of impure semiconductor material of the other conductivity type therein on the outer surface thereof, said first and second ring portions extending into the cylindrical portion to a depth such that pure intrinsic semiconductor material of predetermined thickness separates the ring portions from said core, the first and second ring portions being isolated from each other by a portion of undoped intrinsic semiconductor material therebetween, lead means connected to said core, and means for applying to said first and second ring portions first and second alternating current potentials to be mixed and first and second direct current biasing potentials respectively, the alternating current potentials creating varying electric fields in the regions of the core adjacent the first and second ring portions causing variations in the carrier movement in the core and causing the creation of a current flow therein representing the mixed alternating current frequencies applied to the first and second ring portions.

9. A modulating circuit for gating comprising, in combination, a semiconductor element consisting of a hollow cylindrical portion of intrinsic semiconductor material, the region adjacent the inner surface of the cylindrical portion being doped to form an impure core of one conductivity type, said cylindrical portion of intrinsic semiconductor material having first and second spaced annular ring portions of impure semiconductor material of the other conductivity type disposed therein on the outside thereof, said first and second ring portions extending into the cylindrical portion to a depth such that pure intrinsic semiconductor material of predetermined thickness separates the ring portions from said core, the first and second ring portions being isolated from each other by a portion of undoped intrinsic semiconductor material therebetween, first and second control leads connected to said first and second ring portions, utilization means connected to one end of said core, and means for applying a signal to be gated to the other end of said core, the signal applied to said core being passed to the utilization means only while the first semiconductor ring portion and the second semiconductor ring portion have no substantial direct current potential of predetermined polarity applied to the first and second control leads.

References Cited in the file of this patent

UNITED STATES PATENTS

| | | |
|---|---|---|
| 2,790,037 | Shockley | Apr. 23, 1957 |
| 2,836,797 | Ozarow | May 27, 1958 |
| 2,908,871 | McKay | Oct. 13, 1959 |